(12) United States Patent
Boettiger et al.

(10) Patent No.: US 7,199,931 B2
(45) Date of Patent: Apr. 3, 2007

(54) GAPLESS MICROLENS ARRAY AND METHOD OF FABRICATION

(75) Inventors: Ulrich C. Boettiger, Boise, ID (US); Jin Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/209,695

(22) Filed: Aug. 24, 2005

(65) Prior Publication Data

US 2006/0027887 A1 Feb. 9, 2006

Related U.S. Application Data

(63) Continuation-in-part of application No. 11/002,231, filed on Dec. 3, 2004, and a continuation-in-part of application No. 10/681,308, filed on Oct. 9, 2003.

(51) Int. Cl.
| | |
|---|---|
| *G02B 27/10* | (2006.01) |
| *H04N 3/14* | (2006.01) |
| *H04N 5/335* | (2006.01) |
| *H01L 31/062* | (2006.01) |
| *H01L 31/113* | (2006.01) |

(52) U.S. Cl. .................... 359/619; 359/626; 257/294; 257/440; 348/272

(58) Field of Classification Search ........ 359/618–620, 359/626, 628; 257/292, 294, 432, 440, 443; 348/272, 308

See application file for complete search history.

(56) References Cited

U.S. PATENT DOCUMENTS

| | | | |
|---|---|---|---|
| 5,074,649 A | 12/1991 | Hamanaka et al. | |
| 5,466,926 A | 11/1995 | Sasano et al. | |
| 5,536,455 A | 7/1996 | Aoyama et al. | |
| 6,140,630 A | 10/2000 | Rhodes | |
| 6,204,524 B1 | 3/2001 | Rhodes | |
| 6,310,366 B1 | 10/2001 | Rhodes | |
| 6,326,652 B1 | 12/2001 | Rhodes | |
| 6,333,205 B1 | 12/2001 | Rhodes | |
| 6,376,868 B1 | 4/2002 | Rhodes | |
| 6,734,031 B2 | 5/2004 | Shizukuishi | |
| 6,852,591 B2 | 2/2005 | Rhodes | |
| 7,012,754 B2 | 3/2006 | Boettiger et al. | |
| 7,068,432 B2 | 6/2006 | Boettiger et al. | |
| 2001/0052629 A1 | 12/2001 | Assadi et al. | |
| 2002/0176037 A1 | 11/2002 | Li | |
| 2003/0063204 A1 | 4/2003 | Suda | |
| 2003/0063210 A1 | 4/2003 | Tsuboi | |
| 2003/0210462 A1 | 11/2003 | Freese et al. | |

*Primary Examiner*—Alicia M Harrington
(74) *Attorney, Agent, or Firm*—Dickstein Shapiro LLP

(57) ABSTRACT

A microlens array with reduced or no empty space between individual microlenses and a method for forming the same. The microlens array is formed by patterning a first set of microlens precursors in a checkerboard pattern on a substrate. The first set of microlens precursors is reflowed and cured into first microlenses impervious to subsequent reflows. Then, a second set of microlens precursors is patterned in spaces among the first microlenses, reflowed and cured into second microlenses. The reflows and cures can be conducted under different conditions, and the microlenses may be differently sized. The conditions of the reflows can be chosen to ensure that the focal lengths of microlenses are optimized for maximum sensor signal.

29 Claims, 10 Drawing Sheets

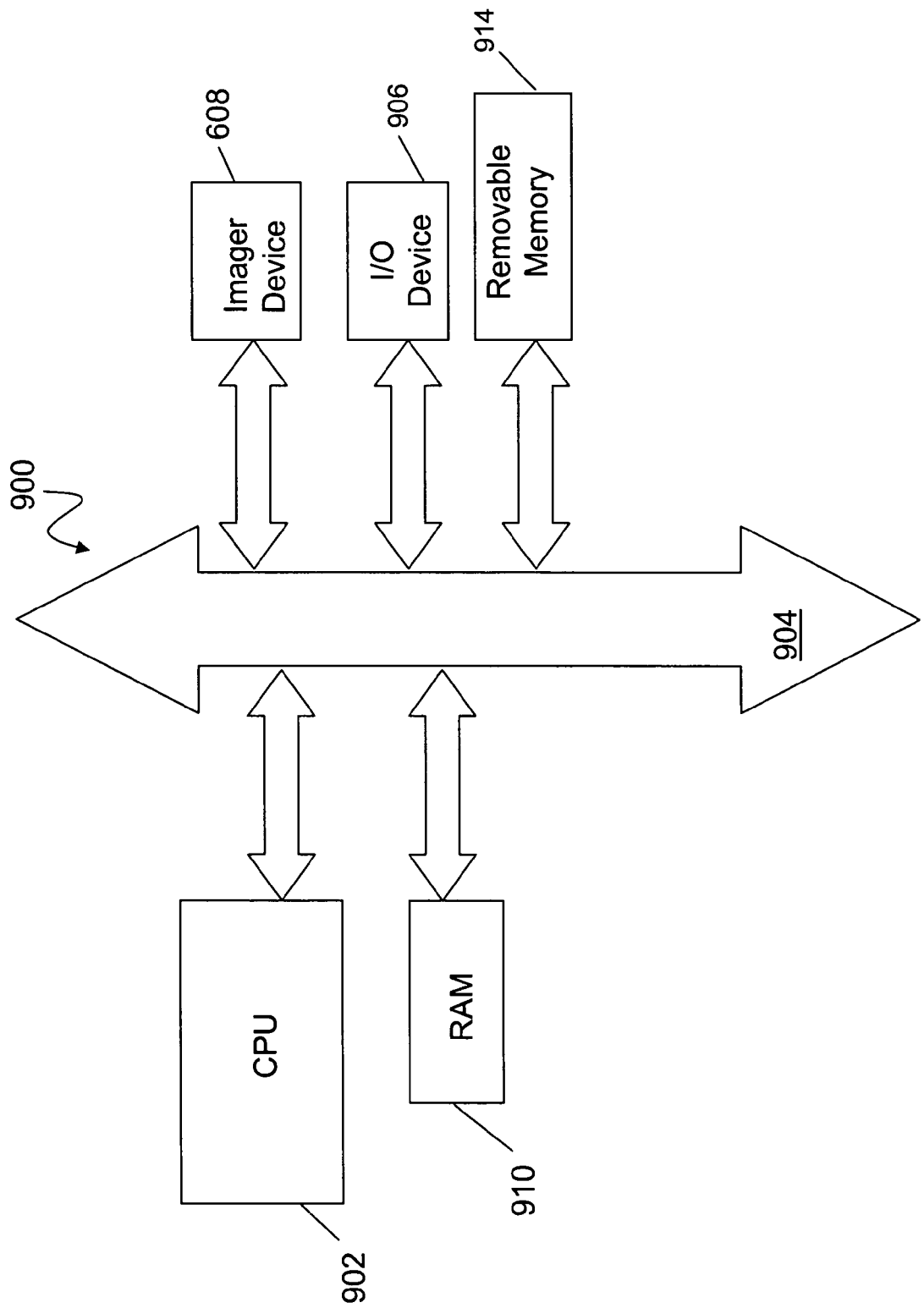

GAPLESS MICROLENS ARRAY AND METHOD OF FABRICATION

CROSS REFERENCE TO RELATED APPLICATIONS

This application is a continuation in-part of application Ser. No. 10/681,308, filed Oct. 9, 2003, and application Ser. No. 11/002,231, filed on Dec. 3, 2004, which are hereby incorporated by reference.

FIELD OF THE INVENTION

The invention relates generally to imaging devices and, more particularly to an array of microlenses used to focus light on photosensors of shared pixel cells, and the method of making said array.

BACKGROUND OF THE INVENTION

Imaging devices, including charge coupled devices (CCD) and complementary metal oxide semiconductor (CMOS) sensors have commonly been used in photo-imaging applications. A CMOS imager circuit includes a focal plane array of pixel cells, each one of the cells including a photo sensor, for example, a photogate, photoconductor or a photo diode for accumulating photo-generated charge in the specified portion of the substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the functions of: (1) photon to charge conversion; (2) accumulation of image charge; (3) resetting the storage region to a known state; (4) transfer of charge to the storage region; (5) selection of a pixel for readout; and (6) output and amplification of signals representing pixel reset level and pixel charge. Photo charge may be amplified when it moves from the initial charge accumulation region to the storage region. The charge at the storage region is typically converted to a pixel output voltage by a source follower output transistor.

Exemplary CMOS imaging circuits, processing steps thereof, and detailed descriptions of the functions of various CMOS elements of an imaging circuit are described, for example, in U.S. Pat. No. 6,140,630; U.S. Pat. No. 6,376,868; U.S. Pat. No. 6,310,366; U.S. Pat. No. 6,326,652; U.S. Pat. No. 6,204,524; U.S. Pat. No. 6,333,205; and U.S. Pat. No. 6,852,591, all of which are assigned to Micron Technology, Inc. The disclosures of each of the foregoing are hereby incorporated by reference in their entirety.

The use of microlenses significantly improves the photosensitivity of the imaging device by collecting light from a large light collecting area and focusing it onto a small photosensitive area of the photosensor. As the size of imager arrays and photosensitive regions of pixels continue to decrease, it becomes increasingly difficult to provide a microlens capable of focusing incident light rays onto the photosensitive regions of the pixel cell. This problem is due in part to the increased difficulty in constructing a microlens that has the optimal focal characteristics for the increasingly smaller imager device. Microlens shaping during fabrication is important for optimizing the focal point of a microlens. This in turn increases the quantum efficiency for the underlying pixel array. Utilizing a spherical microlens shape is better for focusing incoming light onto a narrow focal point, which allows for the desired decrease in photosensor size. Spherical microlenses, however, suffer from gapping problems which are undesirable as described below.

Microlenses may be formed through an additive process. In conventional additive microlens fabrication, an intermediate lens material is deposited in an array onto a substrate and formed into a microlens array using a reflow process. Each microlens is formed with a minimum distance, typically no less than 0.3 microns, between adjacent microlenses. Any closer than 0.3 micrometers may cause two neighboring microlenses to bridge during reflow. In the known process, each microlens is patterned in a material layer as a single square with gaps around it. During reflow of the patterned square microlens material, a gel drop is formed in a partially spherical shape driven by the force equilibrium of surface tension and gravity. The microlenses then harden in this shape. If the gap between two adjacent gel drops is too narrow, they may touch and merge, or bridge, into one larger drop. Bridging changes the shape of the lenses, which leads to a change in focal length, or more precisely the energy distribution in the focal range. A change in the energy distribution in the focal range leads to a loss in quantum efficiency of, and enhanced cross-talk between, pixels.

The problem of bridging is exacerbated by the recently proposed shared pixel cell architecture. For example, U.S. patent application Ser. No. 11/126,275, assigned to Micron Technology, Inc., the full disclosure of which is hereby incorporated, illustrates two-way and four-way pixel cells. Due to the proximity of the photosensors in shared pixel cell architecture and non-uniform photosensor spacing and/or sizes, the fabrication of microlenses over the photosensors is more prone to bridging.

Accordingly, it is desirable to form a microlens array over a pixel cell array having non-uniformly spaced photosensors and/or non-uniform photosensor sizes, such as, for example, photosensors employed in arrays having a shared pixel cell architecture. It is also desirable to form a microlens array having minimized gapping between the microlenses without causing bridging during the microlens fabrication reflow process.

BRIEF SUMMARY OF THE INVENTION

An exemplary embodiment of the invention relates to a microlens array formed over a pixel cell array having at least three pixel cells non-uniformly spaced from each other. A further exemplary embodiment of the microlens array relates to microlenses that have a shifted focal point such that photon radiation is directed towards a photosensitive portion of asymmetrically formed photosensors.

BRIEF DESCRIPTION OF THE DRAWINGS

The above-described features and advantages of the invention will be more clearly understood from the following detailed description, which is provided with reference to the accompanying drawings in which:

FIG. 10 is a schematic diagram of a processor system incorporating the FIG. 9 imaging device in accordance with an exemplary embodiment of the invention.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

As used herein, the terms "semiconductor substrate" and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. The semiconductor need not be silicon-based. The semiconductor could be other semiconductors including, for example, germanium or gallium arsenide. When reference is made to the semiconductor substrate in the following description, previous process steps may have been utilized to form regions or junctions in or over the base semiconductor or foundation.

The term "pixel cell," as used herein, refers to a photo-element unit cell containing a photosensor for converting photons to an electrical signal as may be employed by an imager device. Although the pixel cells are illustrated herein as CMOS four-transistor (or 4-T) pixel cells, it is not intended to be limiting in any way. For example, the pixel cells could have more or less than four transistors and the invention may be employed in any type of solid state imager.

The term "substantially gapless" is intended to cover not only microlens arrays having zero gaps between adjacent microlenses, but is also intended to more broadly encompass microlens arrays having substantially no gapping in areas between the microlenses. For example, a microlens array having approximately 3% or less of its surface area being space not covered by a microlens (i.e., approximately 3% or less gaps), is considered substantially gapless and is within the scope of the invention.

Figure 1:
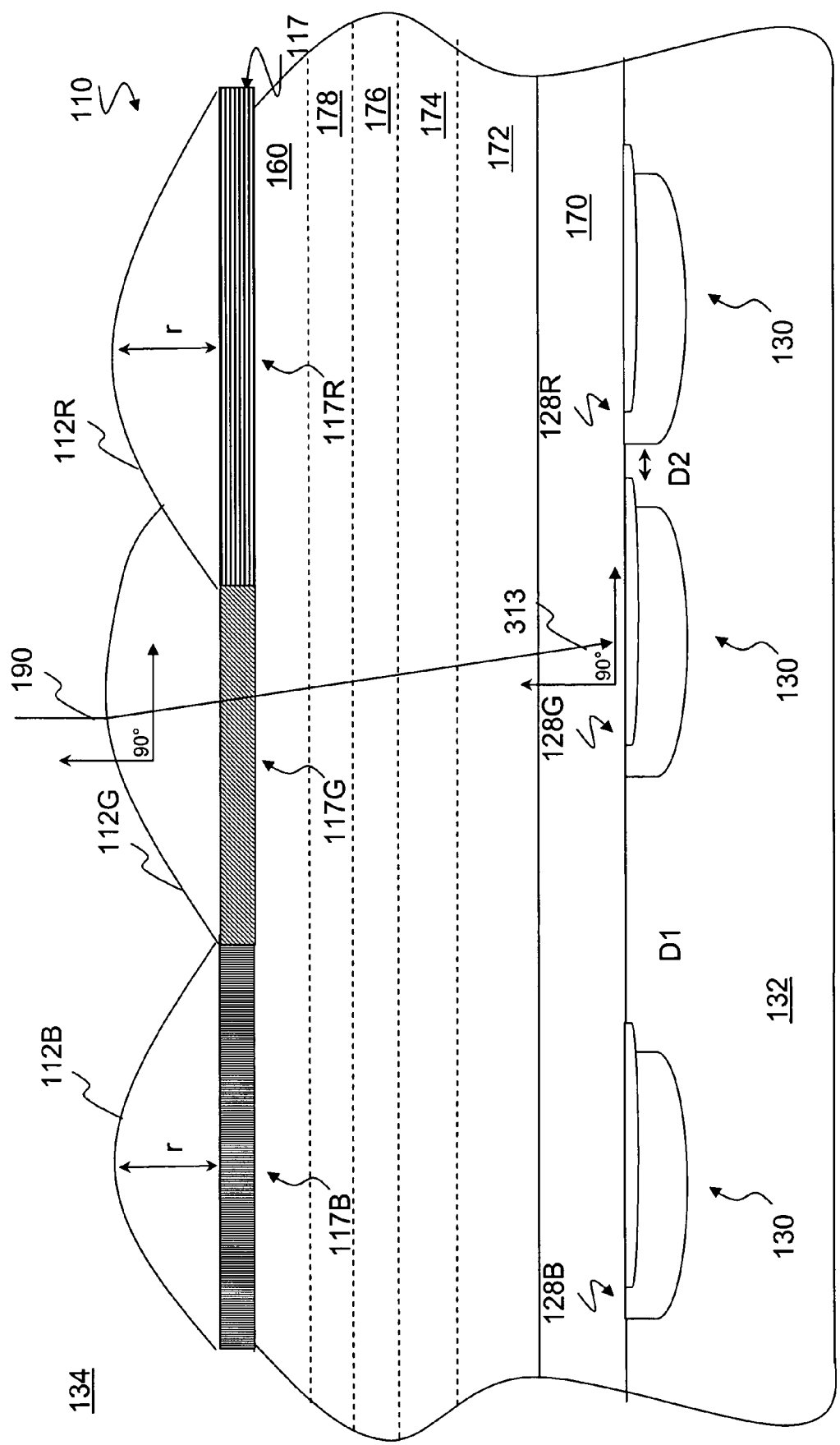
FIG. 1 illustrates a partial cross-sectional view of a semiconductor-based imager constructed in accordance with an exemplary embodiment of the invention.

With reference to the figures, where like numerals represent like elements, FIG. 1 illustrates a partial cross-sectional view of a portion of a semiconductor-based imager 134, such as a CMOS imager, constructed in accordance with an exemplary embodiment of the invention. The imager 134 includes a substantially gapless microlens array 110 formed over a color filter array 117 that is provided over an upper passivation layer 160 of an imager. The substantially gapless microlens array 110 includes first, second and third microlenses 112B, 112G, 112R. The first, second, and third microlenses 112B, 112G, 112R each correspond to a first, second, and third color. For example, the first, second, and third microlenses 112B, 112G, 112R could each correspond to pixel cells 130 having a shared pixel cell architecture (discussed further below with respect to FIG. 2), formed in association with a substrate 132, having blue, green, and red color filters 117B, 117G, 117R formed between the microlens array 110 and the pixel cells 130.

The imager 134 includes other material layers which may be conventionally employed between the photosensors 128B, 128G, 128R and color filters 1171B, 117G, 117R. The additional material layers are illustrated as first, second, third, fourth, and fifth interlayer dielectrics 170, 172, 174, 176, 178. The passivation layer 160 is formed over the fifth interlayer dielectric, and is typically planarized to create a substantially flat surface. The passivation layer 160 can be planarized by chemical mechanical polishing. The passivation layer 160 is typically formed of silicon nitride.

Figure 2:
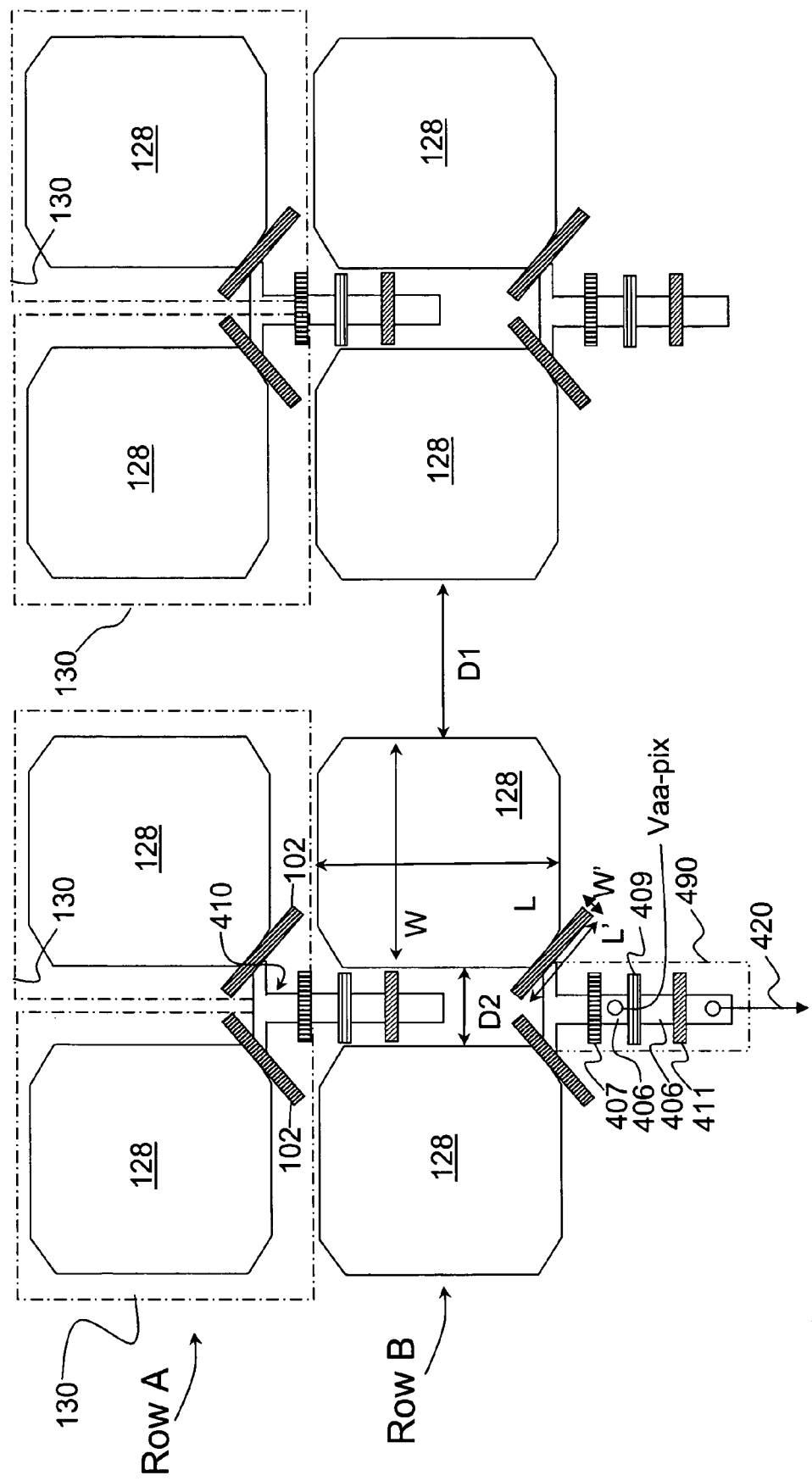
FIG. 2 illustrates a partial top-down view of the FIG. 1 pixel cell array.

The FIG. 1 imager 134 includes a microlens array 110 having overlapping and substantially gapless first, second, and third microlenses 1121B, 112G, 112R. By forming overlapping microlenses e.g., second microlens 112G overlaps the third microlens 112R, the path that photon radiation 190 travels can be tailored to compensate for the shared pixel cell architecture and non-uniform photosensor spacing of the underlying photosensors 128B, 128G, 128R. For example, as illustrated in FIGS. 1 and 2, the distance between a blue photosensor 128B and a green photosensor 128G is a distance D1; whereas the distance between the green photosensor 128G and the red photosensor 128R is a distance D2. As illustrated, the distance D1 is greater than the distance D2; accordingly the photosensor 128G is shifted further to the right relative to the blue photosensor 128B. Accordingly, the corresponding microlens (e.g., second microlens 112G) is formed such that photo radiation striking a top surface of the microlens at an orthogonal angle (i.e., 90°) does not strike the photosensor in an orthogonal angle (i.e., 90°) after passing through the shifted microlens (e.g., second microlens 112G), as illustrated in FIG. 1.

FIG. 2 illustrates a top-down magnified portion of eight pixel cells 130 arranged as four two-way shared pixel cells. As illustrated, two adjacent pixel cells 130 in one row (e.g., Row A) of the array share common pixel components. In addition, each pixel cell 130 has an individual photosensor 128. The photosensors 128 may be any photosensitive structure for converting light photons into electrons (photocharges). For a CMOS imager, each pixel cell 130 may have a respective transfer gate 102 as part of a respective transfer transistors for transferring the accumulated photo-charges from the photosensors 128 to a common storage node, shown as floating diffusion region 410.

Preferably, the transfer gates 102 are angled from the photosensors 128. For example, the longitudinal extent L' of the transfer gates 102 is illustrated as being slanted with respect to the length L and the width W of the associated photosensors 128. The angular geometry of the transfer gate 102 allows for an efficient layout of the length L' and width W' of the transfer gate 102, which may improve the leakage and lag performance of the pixel 130. In addition, the angular layout is also beneficial in maximizing the fill factor of the pixel cell array 110 (FIG. 1), by maximizing the area of the photosensor 128 for each pixel cell 130.

The remaining pixel cell read out components shared between the adjacent pixel cells 130 are illustrated as being on a shared trunk 490, which is located between two column-adjacent pixel cells of a row, and also between pairs of row adjacent pixel cells of a row (e.g., Row B). The shared components on the trunk 490 include a floating diffusion region 410, which serves as a common storage node for the pixel cells 130 receiving charges from photosensors 128 by the transfer gates 102. A reset transistor having a gate 407 is located on a side of the floating diffusion region 410 opposite the photosensors 128. A source/drain region 406 is located on a second side of the reset transistor gate 407, which is capable of receiving a supply voltage $V_{aa-pix}$. The floating diffusion region 410 is also electrically connected to the gate 409 of a source follower transistor, which has a drain coupled to the supply voltage $V_{aa-pix}$. The source follower transistor creates a voltage output signal based on stored charge on the floating diffusion region 410. A row select transistor having a gate 411 has a source/drain connected to the source of the source follower transistor, for selectively reading out the pixel signal to a column line 420.

The FIG. 2 photosensors 128 are provided with microlenses (e.g., first, second, and third microlenses 112B, 112G, 112R of FIG. 1) that are shifted to accommodate the shared pixel cell (e.g., 130) layout. As illustrated in FIGS. 1 and 2, two adjacent shared pixel cells 130 are closer in proximity (illustrated as D2) than are two adjacent non-shared pixel cells 130 (illustrated as D1); accordingly, the microlenses must be formed in closer proximity to one another, and may overlap such that the focal points of the microlenses are on the photosensors 128 of each pixel cell 130.

Although FIG. 1 illustrates the first and third microlenses 112B, 112R having a radius (r) substantially similar to one another, and different from the second microlens 112G, it is not intended to be limiting in any way. For example, the first, second, and third microlenses 112B, 112G, 112R could have substantially different radii from one another, each tailored to the specific color that each microlens is intended to transmit. Similarly, the first, second, and third microlenses 112B, 112G, 112R could have substantially similar or substantially different thicknesses, each tailored to the specific color that each microlens is intended to transmit.

Figure 3:
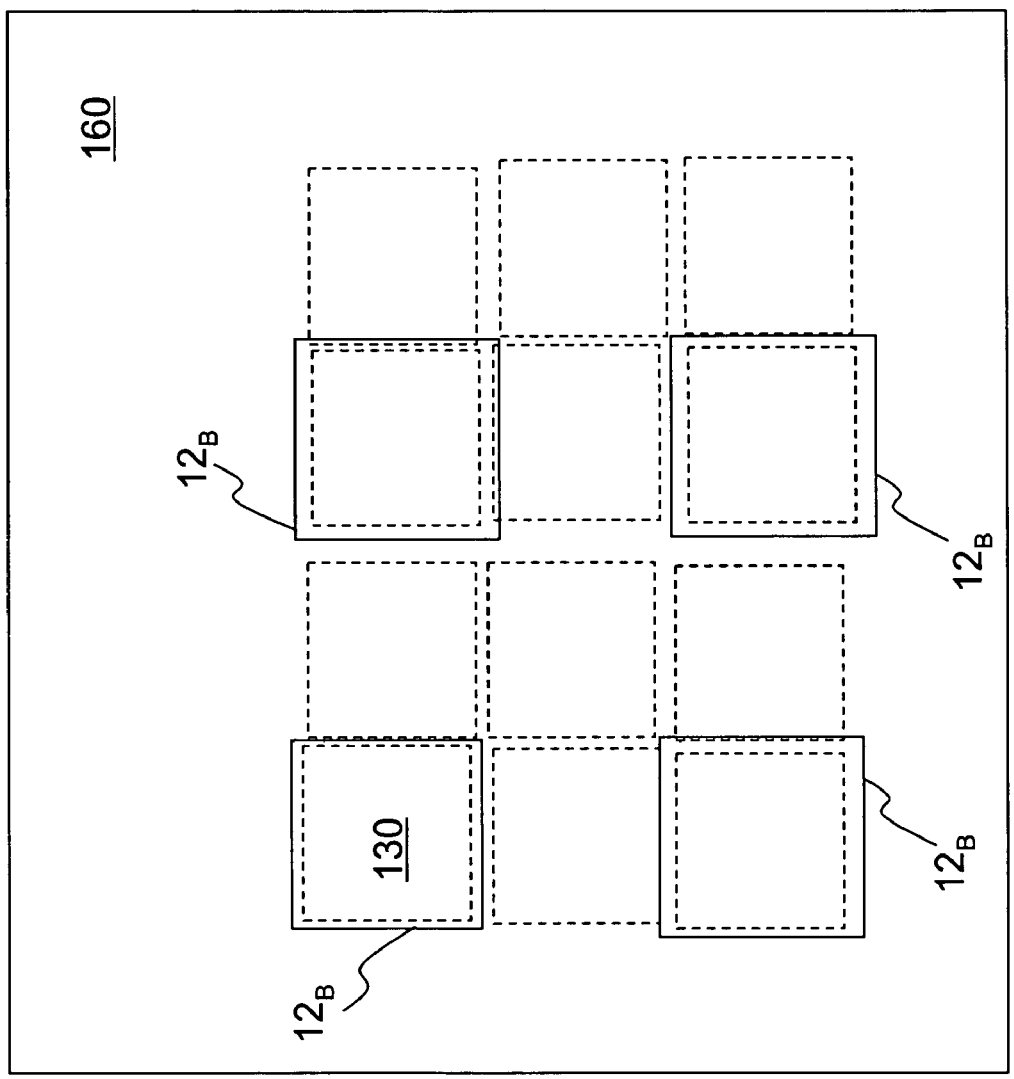
FIGS. 3–6 illustrate an exemplary method of fabricating the FIG. 1 imager.

FIGS. 3–6 illustrate a top-down view of an exemplary embodiment of fabricating the FIG. 1 imager 134. As illustrated in FIG. 3, a first microlens precursor 12B is selectively deposited and patterned over an array of pixel cells 130, e.g., a pixel cell 130 having a color filter 117B (FIG. 1) corresponding to a first color; e.g., blue light, formed between the first microlens 112B (FIG. 1) and the pixel cell 130. The first microlens precursor 12B should be aligned with each photosensor of the pixel cell array. Although each of the first microlens precursors 12B is illustrated as having a substantially rectangular configuration and each being substantially equal in size with the others, it is not intended to be limiting in any way. For example, each of the first microlens precursors 12B could be formed to have other shapes and be substantially different in size from one another.

Figure 4:
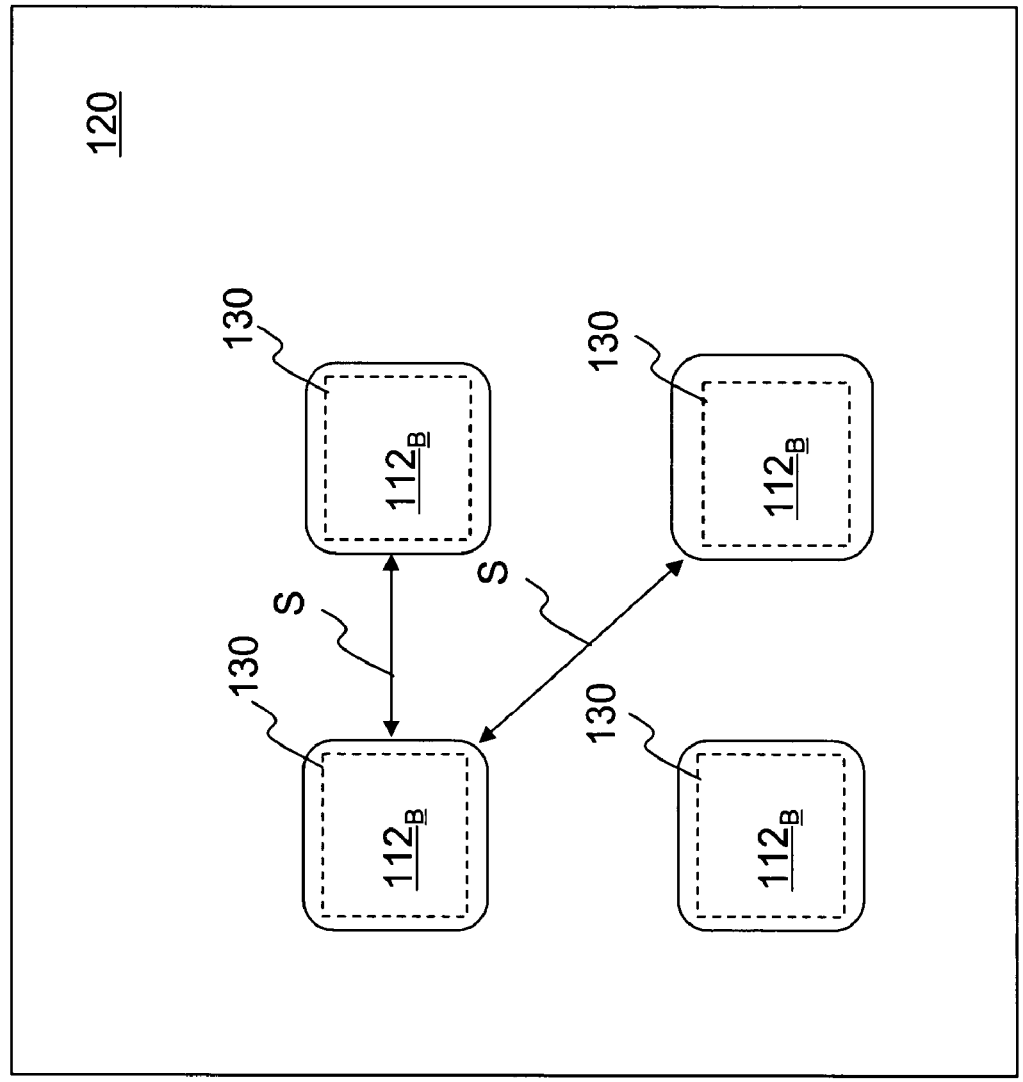

FIG. 4 illustrates a plurality of first microlenses 112B formed from a material that flows into a solidly, cross-linked polymer, upon reflow, and that is impervious to subsequent reflow processes. During a reflow process conducted under reflow conditions, the substantially rectangular configuration of the first microlens precursor 12B (FIG. 3) is transformed into the first microlens 112B, which has a somewhat rectangular configuration with rounded edges and a curved top. The first microlenses 112B, which are transparent to photon radiation, will retain their shape even if a subsequent reflow process is performed.

Figure 5:
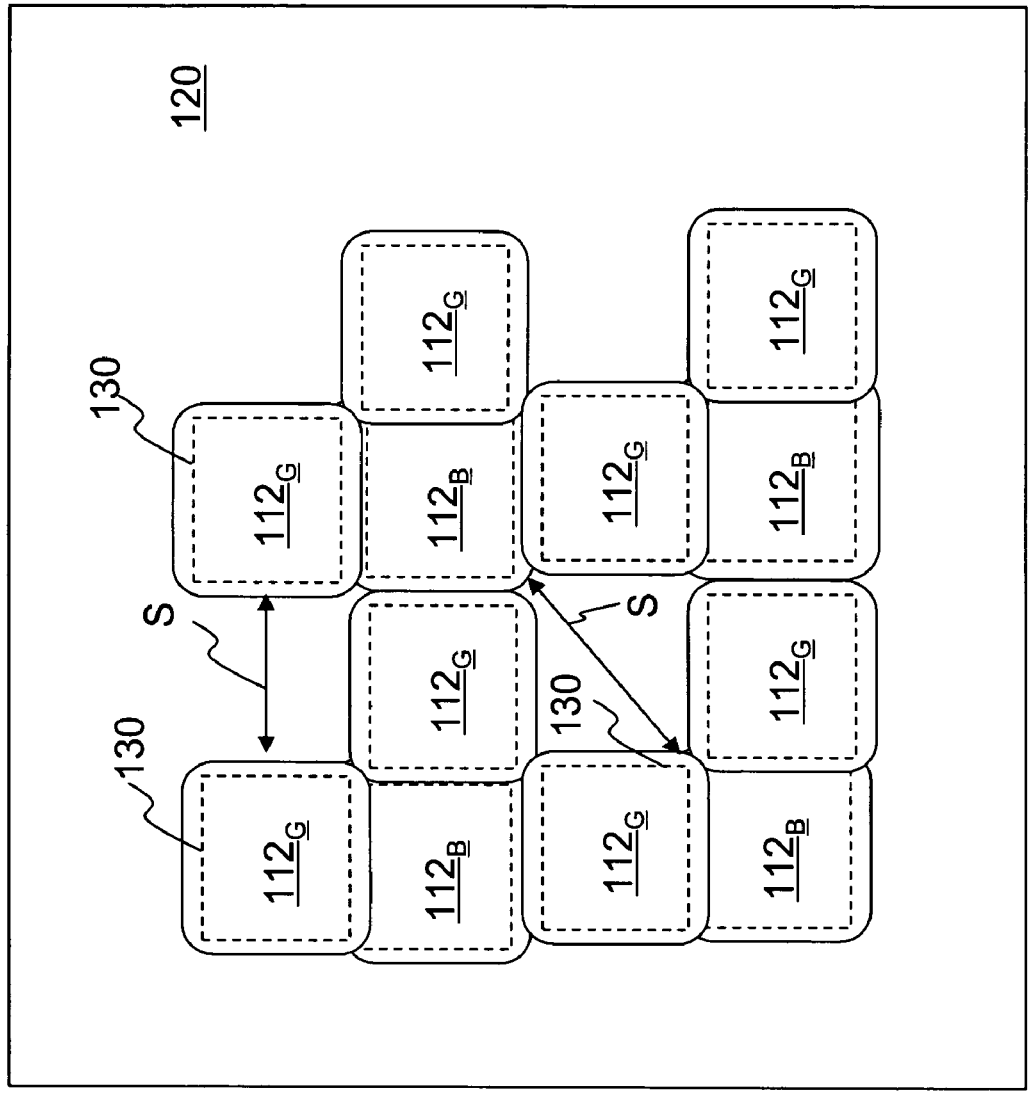

As shown in FIG. 4, there are spaces S between the plurality of first microlenses 112B. After patterning and reflowing the first microlens precursor 12B (FIG. 3) to form the first solidly, cross-linked polymer microlenses 112B, second microlens precursors are patterned and reflowed to form the second microlenses 112G for a second color, e.g., green, as illustrated in FIG. 5. The second microlens precursors are patterned in a substantially rectangular configuration, and positioned in some of the spaces S (FIG. 5) between the first microlenses 112B. Additionally, portions of the second microlenses 112G can be formed overlapping the first microlenses 112B, as discussed above with respect to FIG. 1. It should be noted that the second reflow process may be conducted under different conditions than the first reflow process, if needed.

Figure 6:
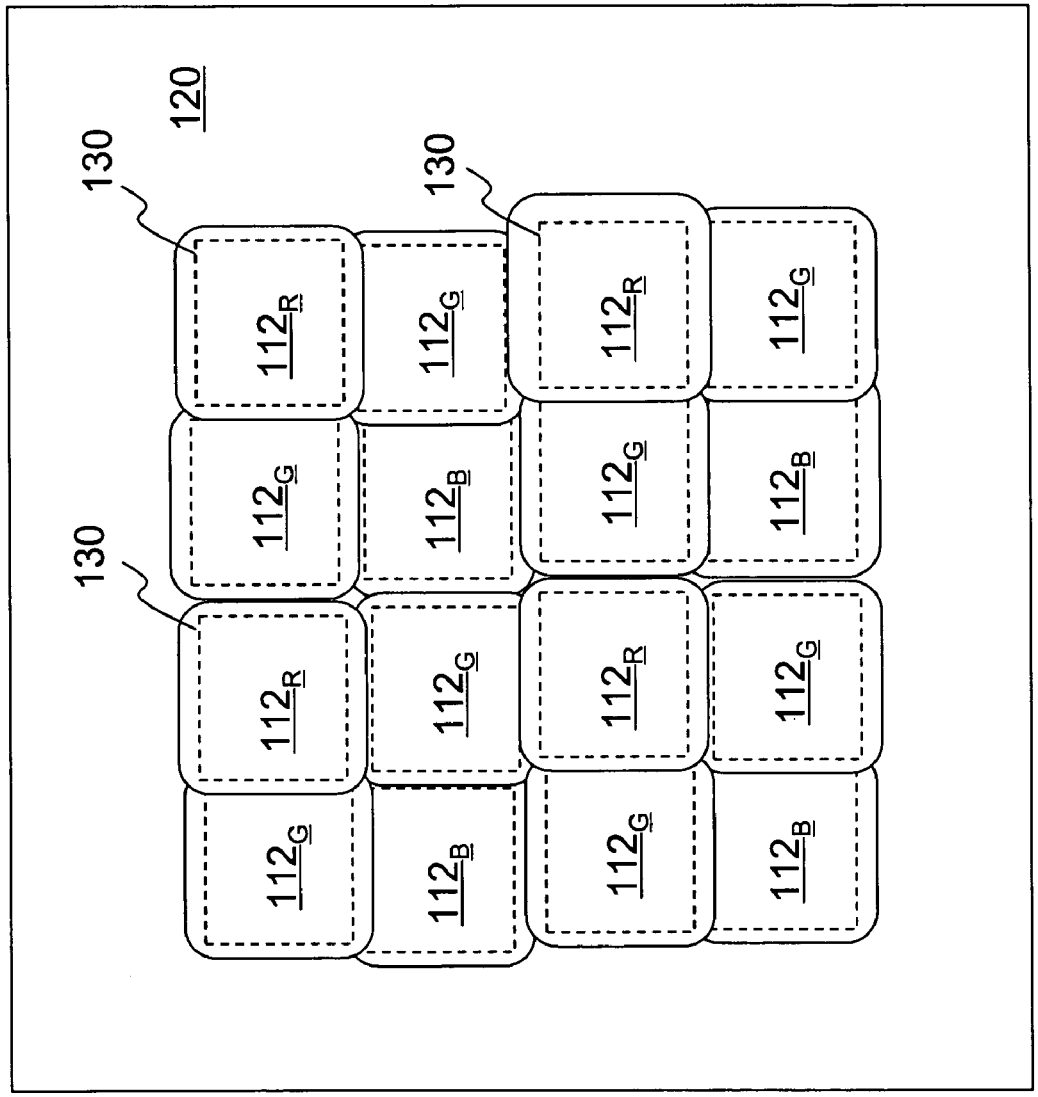

As illustrated in FIG. 5, there are additional spaces S between the first and second microlenses 112B, 112G, where third microlens precursors are patterned and reflowed to form the third microlenses 112R for a third color, e.g., red, as illustrated in FIG. 6. The third microlens precursors are patterned in a substantially rectangular configuration, and positioned in some of the spaces S (FIG. 5) between the first and second microlenses 112B, 112G. Additionally, portions of the third microlenses 112R can be formed overlapping the first and second microlenses 112B, 112G, as discussed above with respect to FIG. 1.

Although the second microlenses 112G are illustrated as being formed simultaneously, it is not intended to be limiting in any way. For example, the second microlenses 112G formed between two first microlenses 112B could be formed prior to second microlenses 112G formed between two third microlenses 112R. Similarly, the order of forming the first, second, and third microlenses 112B, 112G, 112R is not limited by the above-described exemplary embodiment; rather, the first, second, and third microlenses 112B, 112G, 112R can be formed in any order.

By forming the first, second, and third microlenses 112B, 112G, 112R in separate steps, the microlenses 112B, 112G, 112R can be formed such that each microlens has a focal point that is directed to a corresponding photosensor 128 (FIG. 1). The angle, volume, material, and dimensions of the microlenses 112B, 112G, 112R can be manipulated to ensure that photo radiation 190 is directed to the photosensor 128 of the underlying pixel cell 130. In addition, the microlenses 112B, 112G, 112R can be formed to have substantially different focal lengths. For example, as is know in the art, different wavelengths of light are absorbed at different depths of the silicon substrate. Therefore, by forming first, second, and third microlenses 112B, 112G, 112R in separate steps, the focal lengths and focal points can be tailored to each individual wavelength the microlens is intended to transmit.

Although the FIG. 6 imager 134 illustrates sixteen microlenses in the microlens array 110, the array 110 could contain millions of microlenses formed over millions of pixel cells 130 depending upon the resolution of the imager 134.

An example of reflow conditions are described next. The shape of the microlenses after being subjected to reflow conditions is defined by several factors, including the thickness and type of material used to form the microlenses, the reflow temperature profile, and any pretreatment of the material that changes its glass transition temperature $T_g$. Examples of pretreatments that affect reflow include ultraviolet light exposure or preheating the material to a temperature below the glass transition temperature $T_g$. An example of reflow conditions for first microlenses 112B may include providing a plurality of first microlens precursors 12B (FIG. 3) at a first thickness and from a first type of material, exposing the first microlens precursors 12B (FIG. 3) with an ultraviolet light flood exposure of a specific dose, and reflowing at a first temperature ramp rate, followed by a cure. Reflow conditions for second microlenses 112G may include providing second microlens precursors of a second type of material at a second thickness and reflowing the second microlens precursors with the first temperature ramp rate, followed by a cure. Reflow conditions for third microlenses $112_R$ may include providing a third microlens precursors of a third type of material and of a third thickness, pre-heating the material to a temperature below the transition glass temperature $T_g$ of the third microlens precursors for a set period of time, and then reflowing at a second temperature ramp rate, followed by a cure.

Figure 7:
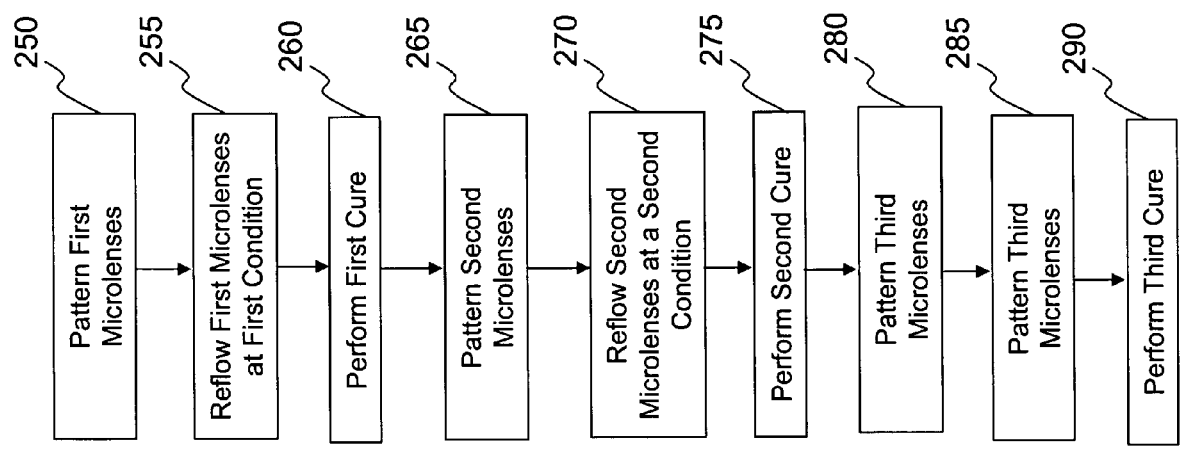
FIG. 7 is a flow diagram illustrating an exemplary method of fabricating the FIG. 1 imager.

FIG. 7 illustrates a flow diagram describing an exemplary process for forming the microlens array 110 (FIG. 6). At step 250, the first microlens precursor 12B (FIG. 3) is patterned on to the color filter array 117 (FIG. 1). The patterning, as described above, can be a checkerboard pattern, which includes spaces between portions of the first microlens precursor 12B (FIG. 3). A single reticle may be used to prepare each of the first microlens precursor 12B (FIG. 3) patterns. In the patterning step, a thin film of microlens material of a first thickness is coated on the substrate, the material is exposed using a suitable mask, and it is developed to either dissolve the exposed microlens material (positive resist) or dissolve the unexposed microlens material (negative resist). At step 255, the first microlens precursor 12B (FIG. 3) is reflowed. Reflowing of the first microlens precursor 12B (FIG. 3) turns the material into the first microlenses 112B (FIG. 4). At step 260, the first microlenses 112B (FIG. 4) are cured, thus forming a checkerboard pattern of solidly, cross-linked first microlenses 112B (FIG. 4).

At step 265, the second microlens precursors are patterned on to the color filter array 117 (FIG. 3) in some of the spaces between the first microlenses 112B (FIG. 4). A single reticle may be used to prepare each of the second microlens precursors depositions. If the second microlens precursors patterns are of the same size as the first microlens precursor 12B (FIG. 3), the same reticle used for the first microlens precursor 12B (FIG. 3) patterns may be used for the pattern of the second microlens precursors. To create the pattern of the second microlens precursors, the reticle is shifted.

At step 270, the second microlens precursors may be reflowed to form the second microlenses 112G (e.g., FIG. 5). The reflow conditions for the second microlens precursors may be different or the same as the reflow conditions for the first microlens precursors, depending on the application. For example, the reflow conditions for the second microlens precursors could entail varying the exposure and/or the dose of bleaching or the baking step temperature. By using different reflow conditions, the first microlenses 112B (e.g., FIG. 5) and second microlenses 112G (e.g., FIG. 5) can be formed having same or different focal lengths. At step 275, a second cure process is performed.

At step 280, third microlens precursors are patterned in remaining open spaces between the first and second microlenses 112B, 112G (e.g., FIG. 5). At step 285, the third microlens precursors may be reflowed at a reflow condition to form the third microlenses 112R (e.g., FIG. 6). The reflow conditions used to form the third microlenses 112R may be different or the same as the conditions used to form the first and second microlenses, for example, by varying the doses of exposing and/or bleaching or the baking step temperature. By using different reflow conditions, the third microlenses 112R (e.g., FIG. 6) can be formed such that their focal lengths are the same as or different from than the focal lengths of the first and second microlenses 112B, 112G, (e.g., FIG. 6). At step 290, a third cure process is performed.

The advantages of forming the first, second, and third microlenses 112B, 112G, 112R in separate steps include the potential to tailor each microlens to the specific color the microlenses are intended to transmit, and to better align the first, second, and third microlenses 112B, 112G, 112R with the photosensors 128 of the shared pixel cell array 110.

Figure 8:
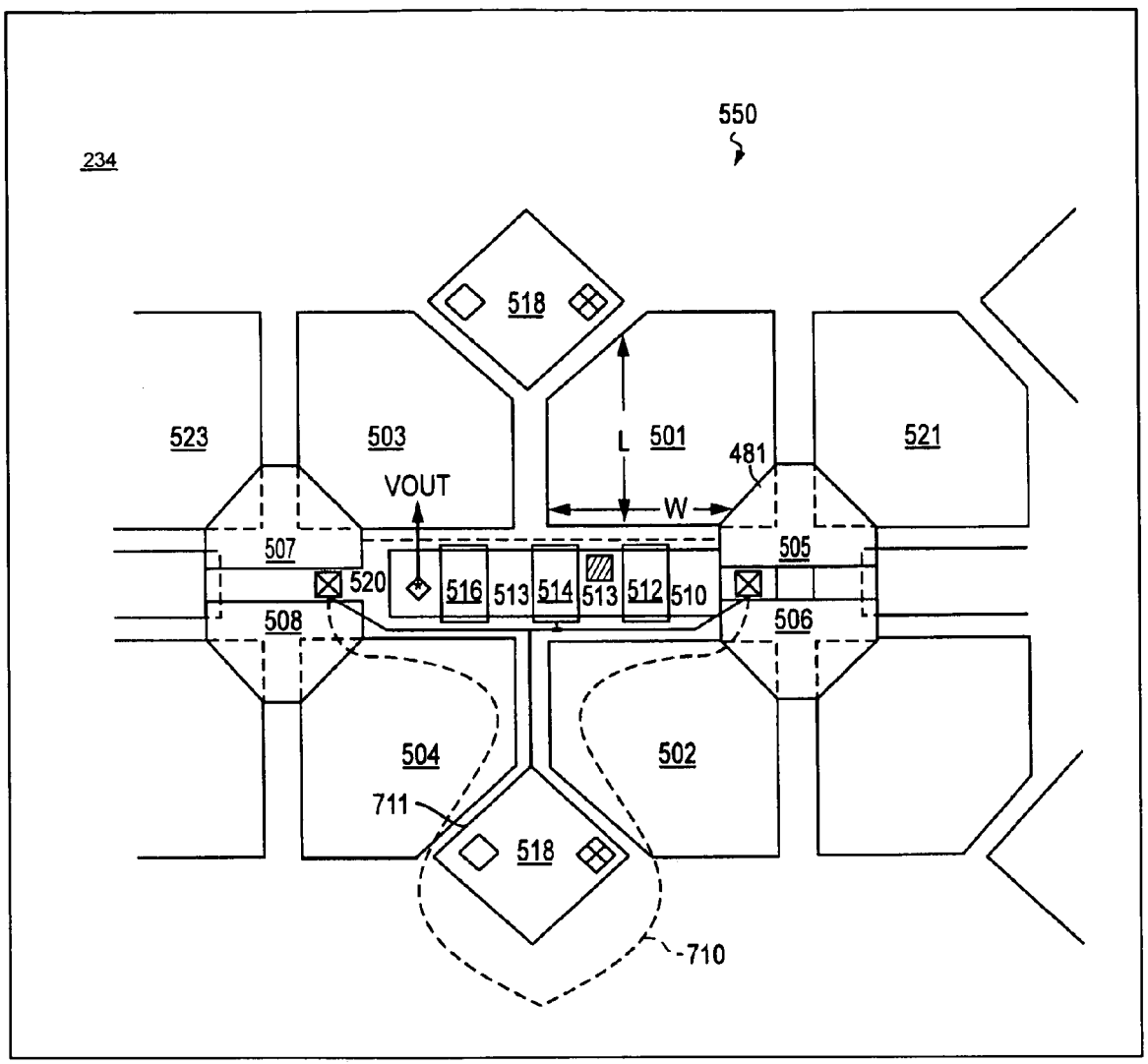
FIG. 8 illustrates a partial top-down view of a pixel cell array constructed in accordance with a second exemplary embodiment of the invention.

Although the exemplary embodiment of the invention has been described for two-way shared pixel cells (e.g., 130 (FIG. 2), the invention has broader applicability to other shared pixel cell architectures. For example, FIG. 8 illustrates a top-down portion of a four-way shared pixel cell array 550, which may employ the invention. In the FIG. 8 array, pixel cells have a non-uniform spacing throughout the array due to the shared read out architecture and the photosensors are also of irregular shape.

As illustrated, the pixel cell array 550 has a plurality of pixel cells that are four-way shared pixel cells, each having respective photosensors 501, 502, 503, 504. The illustrated pixel cells have a shared architecture shown by dotted lines area 710 in FIG. 8. The shared architecture includes a linearly-extending trunk located within the area between the pair of photosensors 501, 503 and the pair of photosensors 502, and 504.

Each pixel cell has a transfer transistor having an associated gate 505, 506, 507, 508. At least a portion of the transfer transistor gates 505, 506, 507, 508 are preferably at an angle 481 with respect to the photosensors 501, 502, 503, 504 as illustrated in FIG. 8. It should also be noted that the transfer transistor gates 505, 506, 507, 508 of this embodiment are being shared, each among two adjacent pixels in a row. For example, column adjacent pixel photosensors 501 and 521 in the same row each share the transfer gate 505 and column adjacent pixels 503, 523 in the same row share the transfer transistor gate 507. The two illustrated pixels (having associated photosensors 501, 521) that share a transfer transistor gate (505), however, do not share a floating diffusion region or readout circuit. Rather, this embodiment has two row adjacent pixels having photosensors 501 and 502 sharing a first floating diffusion region 510, and two row adjacent photosensors and 503, 504 sharing a second floating diffusion region 520. The two floating diffusion regions 510, 520 are electrically connected to one another and to one electrode of an associated capacitor 518 through a first metallization layer formed above the surface of the pixel array 550. Each capacitor 518 is connected at another side (not shown) to a contact receiving a source voltage, e.g., Vaa-pix, at source/drain region 513 through a second metallization layer.

One reset transistor gate 512 is utilized for resetting the charges at both floating diffusion regions 510, 520 and the associated capacitor 518. To one side of the reset gate 512 is a source/drain region 513 that is capable of receiving a supply voltage $V_{aa-pix}$. The four pixel cells having associated photosensors 501, 502, 503, 504 share a common readout circuit that includes a source follower transistor having a gate 514 and a row select transistor having a gate 516. The four pixels also share the capacitor 518, which can increase the storage capacity of the two associated floating diffusion regions 510, 520.

The four-way shared pixel layout described herein illustratively has two column-adjacent pixels having respective photosensors 501, 502 and two column-adjacent pixels having respective photosensors 503, 504 sharing one set of readout circuitry 710. Thus, a column output line 711 is only necessary, in accordance with this exemplary embodiment, for every other column. Additionally, because two row-adjacent pixels share a common transfer gate signal, two column adjacent pixels in adjacent rows will be read onto the same output line 711 at nearly the same time. The respective signals from these pixels needs to be separately handled in order to maintain maximum resolution for the pixel array 550.

The illustrated 4-way shared pixel array configuration has at least two distinct advantages: it allows for larger pitch circuits in the periphery in the column direction and it reduces the metallization layers needed in the layers above the surface of the pixel array 550 while increasing the photosensitive area and thus quantum efficiency over the conventional pixel array. In addition, each capacitor 518 is efficiently located at the corners of four photosensors, such as shown at the clipped edges 711 of photosensors 502, 504. This location allows for a maximized capacitor area without sacrificing photosensitive area, or thereby decreasing the fill factor of the pixels array 550.

The proximity of the photosensors 501, 502, 503, 504, however, demands that the microlenses are formed in close proximity as well. By utilizing the method discussed above with respect to FIGS. 3–7 (i.e., forming first, second, and third microlenses in separate steps), the microlenses formed over the photosensors 501, 502, 503, 504 can be formed such that the focal points of each of the microlenses corresponds to a respective photosensor. As discussed above with respect to FIG. 1, the microlenses could be formed to overlap such that the corresponding focal length of the microlens may be shifted to accommodate the proximity of the FIG. 8 photosensors 501, 502, 503, 504.

Figure 9:
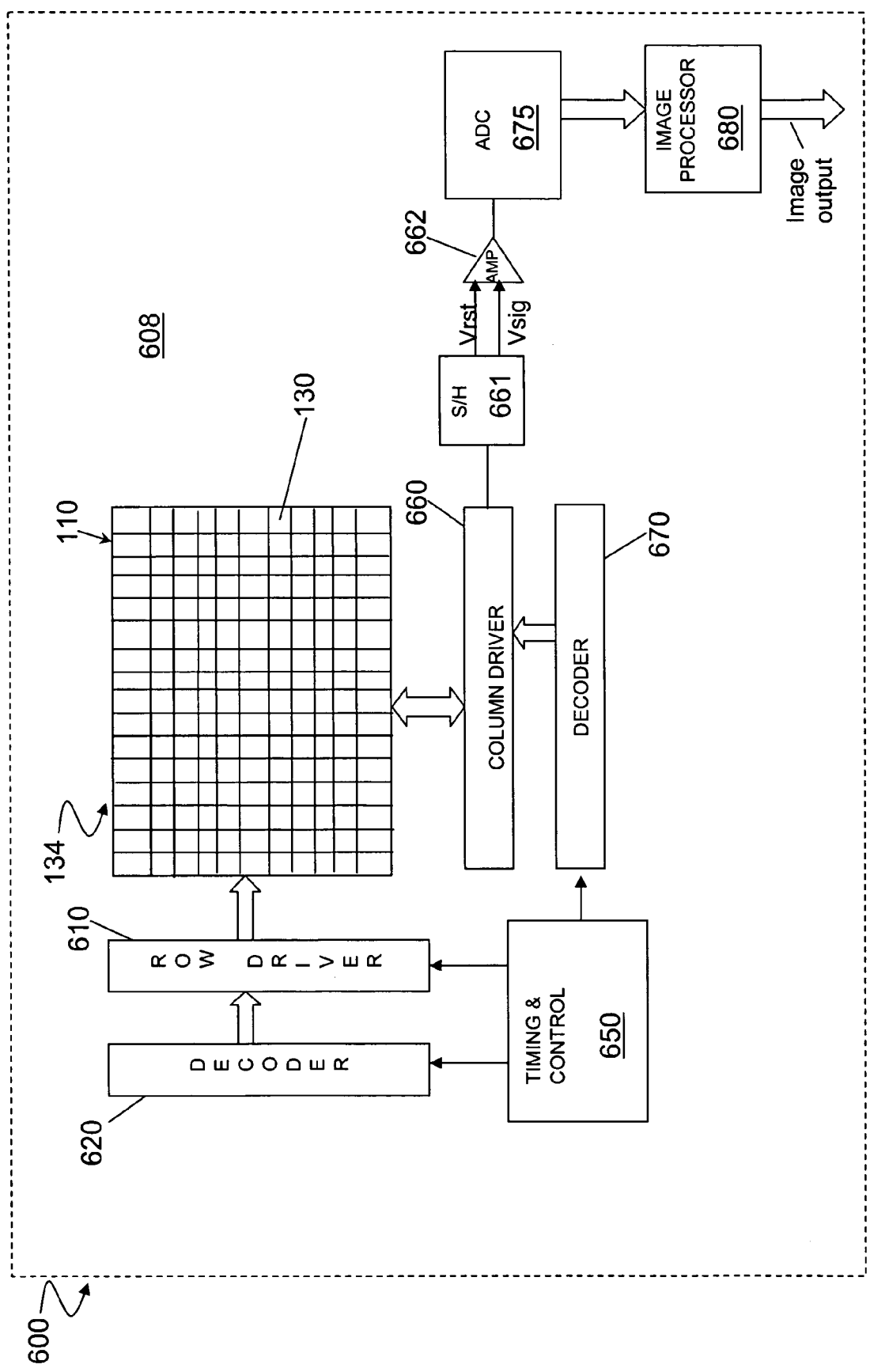
FIG. 9 is a block diagram of an imaging device incorporating the imager constructed in accordance with FIG. 1.

FIG. 9 illustrates an imaging device 608 incorporating an imager 134, 234 constructed in accordance with exemplary embodiments of the invention. For the sake of clarity, the imaging device 608 will be described as including the FIGS. 1–6 imager 134.

In operation of the FIG. 9 imaging device 608, the pixel cells 130 of each row in the imager 134 are all turned on at the same time by a row select line, and the pixel cells 130 of each column are selectively output by respective column select lines. A plurality of row and column lines are provided for the entire array 110. The row lines are selectively activated in sequence by the row driver 610 in response to row address decoder 620 and the column select lines are selectively activated in sequence for each row activation by the column driver 660 in response to column address decoder 670. Thus, a row and column address is provided for each pixel cell 130. The imaging device 608 is operated by the control circuit 650, which controls address decoders 620, 670 for selecting the appropriate row and column lines for pixel readout, and row and column driver circuitry 610, 660, which apply driving voltage to the drive transistors of the selected row and column lines.

The pixel output signals typically include a pixel reset signal $V_{rst}$ taken off of the floating diffusion region (via the source follower transistor) when it is reset and a pixel image signal $V_{sig}$, which is taken off the floating diffusion region (via the source follower transistor) after charges generated by an image are transferred to it. The $V_{rst}$ and $V_{sig}$ signals are read by a sample and hold circuit 661 and are subtracted by a differential amplifier 662, which produces a difference signal ($V_{rst}-V_{sig}$) for each pixel cell 130, which represents the amount of light impinging on the pixel cell 130. This signal difference is digitized by an analog-to-digital converter (ADC) 675. The digitized pixel signals are then fed to an image processor 680 to form a digital image output. In addition, as depicted in FIG. 9, the imaging device 608 may be included on a single semiconductor chip (e.g., chip substrate 600).

FIG. 10 shows a system 900, a typical processor system modified to include an imaging device (such as the FIG. 9 imaging device 608) of the invention. The processor system 900 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other systems employing an imager.

System 900, for example a camera system, generally comprises a central processing unit (CPU) 902, such as a microprocessor, that communicates with an input/output (I/O) device 906 over a bus 904. CMOS imager device 608 also communicates with the CPU 902 over the bus 904. The processor-based system 900 also includes random access memory (RAM) 910, and can include removable memory 914, such as flash memory, which also communicate with the CPU 902 over the bus 904. The imaging device 608 may be combined with a processor, such as a CPU, digital signal processor, or microprocessor, with or without memory storage on a single integrated circuit or on a different chip than the processor.

It should again be noted that although the invention has been described with specific references to CMOS imaging devices (e.g., 134, 234 of FIGS. 1–6 and 8), the invention has broader applicability and may be used in any imaging apparatus. For example, the invention may be used in conjunction with charge coupled device (CCD) imagers. The above description and drawings illustrate preferred embodiments which achieve the objects, features, and advantages of the invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. An imager comprising:
    a pixel cell array including a plurality of pixel cells arranged into a plurality of rows and columns, said array comprising:
        at least first, second, and third pixel cells having corresponding first, second, and third photosensors, said first and second photosensors having a first distance between each other, and said second and third photosensors having a second distance between each other, said first and second distances being different from one another,
        a common storage node shared by at least two of said first, second, and third photosensors, a shared readout circuit connected to said common storage node, and a substantially gapless microlens array formed over said pixel cell array, said microlens array having at least first, second, and third microlenses having a focal point corresponding to said first, second, and third photosensors of said pixel cell array.

2. The imager of claim 1, further comprising a color filter array between said pixel cell array and said microlens array.

3. The imager of claim 2, wherein said color filter array comprises at least first, second, and third color filters.

4. The imager of claim 3, wherein said first, second, and third color filters correspond to blue, green, and red color filters.

5. The imager of claim 3, wherein said first, second, and third color filters correspond to cyan, magenta, and yellow color filters.

6. The imager of claim 1, wherein each microlens of said microlens array has a focal plane that is substantially the same.

7. The imager of claim 1, wherein at least some microlenses of said microlens array have a focal plane that is different from other microlenses of said array.

8. The imager of claim 1, wherein each microlens of said microlens array has a thickness that is substantially the same.

9. The imager of claim 1, wherein said microlens array includes color sets of microlenses with each set of microlenses having a thickness corresponding to the set color.

10. The imager of claim 1, wherein said first distance is greater than said second distance.

11. The imager of claim 1, further comprising fourth and fifth pixel cells having fourth and fifth photosensors, and wherein said common storage node is shared by at least two of said first, second, and third photosensors and said fourth and fifth photosensor.

12. An integrated circuit, comprising:
a pixel cell array including a plurality of pixel cells arranged into a plurality of rows and columns, said array comprising:
at least first, second, and third pixel cells having corresponding first, second, and third photosensors, said first and second photosensors having a first distance between each other, and said second and third photosensors having a second distance between each other, said first and second distances being different from one another,
a common storage node shared by at least said first, second, and third photosensors,
a shared readout circuit connected to said common storage node, and
a substantially gapless microlens array formed over said pixel cell array, said microlens array having at least first, second, and third microlenses having a focal point corresponding to said first, second, and third photosensors of said pixel cell array.

13. The integrated circuit of claim 12, wherein each microlens of said array of microlenses has a distance between each other that is substantially the same.

14. The integrated circuit of claim 12, further comprising a color filter array between said pixel cell array and said microlens array.

15. The integrated circuit of claim 12, wherein said microlens array includes color sets of microlenses with each set of microlenses having a thickness corresponding to the set color.

16. A processor system, comprising:
a processor; and
an imager coupled to said processor, said imager comprising:
a pixel cell array formed in a substrate, said pixel cell array having an array of at least first, second, and third photosensors, a distance between said first and second photosensors being different than a distance between said second and third photosensors, and
an array of microlenses over said photosensor array, said microlens array having at least one microlens overlapping an adjacent microlens such that incoming photo radiation striking a top surface of at least one microlens at an orthogonal angle does not strike a photosensor of said corresponding pixel cell at an orthogonal angle after passing through said at least one microlens.

17. The processor system of claim 16, wherein at least two of said first, second, and third photosensors share a common storage node.

18. The processor system of claim 16, wherein said common storage node is coupled to a shared readout circuit.

19. The processor system of claim 16, wherein said pixel cell array further comprises fourth and fifth photosensors, wherein at least two of said first, second, third photosensors and said fourth and fifth photosensors share a common storage node and readout circuitry.

20. The processor system of claim 16, wherein said array of microlenses is substantially gapless.

21. The processor system of claim 16, wherein a thickness of each microlens of said array microlenses is selected from the group consisting of first, second, and third thicknesses.

22. The processor system of claim 21, wherein said first, second, and third thicknesses correspond to a first, second, and third wavelength.

23. A method of forming an imager, comprising:
providing a pixel cell array having at least one photosensor spaced unequally from surrounding photosensors;
patterning a first set of microlens precursors onto a substrate formed over said pixel cell array;
reflowing the first set of microlens precursors under first reflow conditions;
curing the first set of microlens precursors to form first microlenses;
patterning a second set of microlens precursors onto the substrate;
reflowing the second set of microlens precursors; and
curing the second set of microlens precursors to form second microlenses,
wherein the second microlenses are each positioned in a space among the first microlenses and have a shifted focal point such that photo radiation striking a top surface of said second microlens at an orthogonal angle does not strike said at least one photosensor at an orthogonal angle after passing through said second microlens.

24. The method of claim 23, wherein said first and second reflow conditions are chosen to create a focal length in said first microlenses substantially equal to a focal length in said second microlenses.

25. The method of claim 24, wherein said first and second reflow conditions are chosen to create a focal length in said first microlenses corresponding to a first wavelength of light and to create a focal length in said second microlenses corresponding to a second wavelength of light, wherein said first and second wavelengths are different.

26. The method of claim 23, wherein said patterning the first set of microlens precursors comprises patterning the first set of microlens precursors into a first plurality of portions arranged in a checkerboard pattern, the checkerboard pattern including spaces between said portions.

27. The method of claim 26, wherein said patterning the second set of microlens precursors comprises patterning the second set of microlens precursors into a second plurality of portions in a second checkerboard pattern filling in said spaces between the plurality of portions of the first set of microlens precursors.

28. The method of claim 23, further comprising:
patterning a third set of microlens precursors onto the substrate;
reflowing the third set of microlens precursors; and
curing the third set of microlens precursors to form third microlenses.

29. The method of claim 28, wherein the patterning and reflow conditions of said first set, second set, and third set of microlens precursors create a microlens array being substantially gapless.

* * * * *